United States Patent [19]

Gris et al.

[11] Patent Number: 4,561,932
[45] Date of Patent: Dec. 31, 1985

[54] METHOD OF PRODUCING INTEGRATED SILICON STRUCTURES ON ISOLATED ISLETS OF THE SUBSTRATE

[75] Inventors: Yvon Gris, Tullins; Agustin Monroy, St. Martin d'Heres, both of France

[73] Assignee: Societe pour l'Etude et la Fabrication de Circuits Integres Speciaux E.F.C.I.S., Grenoble, France

[21] Appl. No.: 667,587

[22] Filed: Nov. 2, 1984

[30] Foreign Application Priority Data

Nov. 4, 1983 [FR] France ............................. 83 17584

[51] Int. Cl.⁴ ...................... H01L 21/306; B44C 1/22; C03C 25/06; C03C 15/00
[52] U.S. Cl. ................................ 156/643; 29/576 W; 29/580; 156/646; 156/648; 156/649; 156/651; 156/653; 156/657; 156/662; 357/49; 427/93
[58] Field of Search ............... 156/643, 646, 647, 651, 156/653, 657, 659.1, 661.1, 662, 648, 649; 29/571, 576 W, 580; 427/93; 357/49, 52, 56

[56] References Cited

U.S. PATENT DOCUMENTS 4,264,382  4/1981  Anantha et al. : ............... 156/648 X
4,502,913  3/1985  Lechaton et al. ................... 156/643

Primary Examiner—William A. Powell
Attorney, Agent, or Firm—Roland Plottel

[57] ABSTRACT

A method for manufacturing integrated circuits is provided in which monocrystalline silicon islets are formed completely isolated from the substrate itself made from monocrystalline silicon, by a thick oxide layer.

This thick oxide layer is formed in the following way: silicon islets are formed whose top and sides are protected with silicon nitride. Then the silicon is etched isotropically, which hollows out deeply under the islets. Thick oxidization then makes up the whole of the silicon under the islets.

Thus isolated silicon islets are obtained of the same crystalline quality as the substrate.

3 Claims, 6 Drawing Figures

METHOD OF PRODUCING INTEGRATED SILICON STRUCTURES ON ISOLATED ISLETS OF THE SUBSTRATE

BACKGROUND OF THE INVENTION

1. Field of the Invention

The present invention relates to integrated circuit structures incorporating monocrystalline semi-conductor zones dielectrically isolated from the substrate which supports them.

2. Description of the Prior Art

These structures are differentiated from the conventional structures in which the integrated circuit elements are formed directly in the volume of semi conductor substrate and are only isolated from each other by reverse bias junctions. They are used when it is desired to have a more efficient isolation than junction isolation.

The processes used for forming a dielectric isolation are expensive and difficult to put into practice.

Among them may be mentioned the use of completely isolating substrates such as corindon instead of a semi conductor substrate; monocrystalline silicon is grown on the substrate and the silicon is etched so as to leave only separate islets which are dielectrically isolated from each other since they rest on the isolating substrate. This technique is delicate for corindon is a fragile material, heavy and difficult to work, and unable to stand up to thermal shocks. In addition, the crystalline quality of the silicon deposited on the corindon is not very good.

There may also be mentioned complex and expensive implementation techniques in which, by different deposits and reversal of silicon wafers, completely isolated silicon islets may be created (EPIC technique).

The recrystallization of amorphous silicon deposited on a silicon substrate coated with isolating oxide is also a technique for forming dielectrically isolated islets on the substrate, but the crystalline quality of these islets obtained by recrystallization of amorphous silicon is relatively poor (presence of grains at the edge of the recrystallized zone).

SUMMARY OF THE INVENTION

The present invention provides a new method for forming islets dielectrically isolated with respect to the substrate which supports them, this method having the advantage of being particularly simple, inexpensive, allowing a monocrystalline silicon substrate to be used and offering a good crystalline quality of the islets since the islets are formed from the monocrystalline substrate itself. In addition, this method is perfectly compatible with conventional manufacturing processes in which the circuit elements are junction isolated and not dielectrically isolated, so that we may find in the same circuit junction isolated elements (formed in the volume of the substrate) and dielectrically isolated elements (formed on dielectrically isolated islets of the substrate).

The process of the invention comprises the following steps:

a. a monocrystalline silicon wafer is provided which is coated, possibly after a thin oxidization layer, with a first layer of silicon nitride, b. the nitride is etched with a pattern leaving zones of small width, c. the monocrystalline silicon is hollowed out vertically, outside the places protected by the nitride, so that monocrystalline silicon islets remain whose upper surface is coated with nitride, d. a second silicon nitride layer is deposited which covers the surface of the wafer as well as the sides of the islet and the first nitride layer, e. vertical anisotropic etching of the nitride is carried out until the silicon is bared outside the islets, the nitride of the second layer then remaining on the sides of the islets and that of the first layer remaining on the top of the islets, f. isotropic etching of the bared silicon is carried out, outside the islets protected by the nitride, this etching extending partially under the islets, g. thick thermal oxidization of the wafer is carried out for a period of time sufficient for a layer of silicon oxide to form extending completely under the islets and dielectrically isolating them from the substrate, h. the nitride layer remaining on the islets is removed.

BRIEF DESCRIPTION OF THE DRAWINGS

Other features and advantages of the invention will be clear from the following detailed description with reference to the accompanying drawings in which.

DESCRIPTION OF THE PREFERRED EMBODIMENT

A substrate 10 is provided which is a monocrystalline silicon wafer which is uniformly coated, after formation of a thin silicon oxide layer 12 (about 500 angströms), with a layer of silicon nitride 14. The oxide is simply for preventing the nitride layer from lowering the crystalline quality of the silicon surface which it covers.

Figure 1:
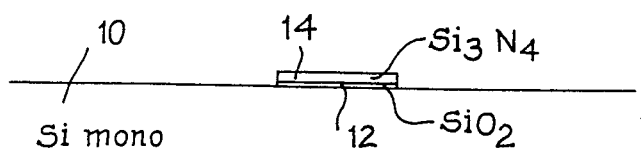
FIGS. 1 to 6 show the successive steps of the manufacturing process of the invention.

Layers 14 and 12 are etched with a pattern leaving islets of small width at the position where it is desired to have monocrystalline silicon islets dielectrically isolated from the substrate. Such etching of the nitride is carried out conventionally after a layer of resin has been deposited, exposed through an appropriate mass, developed and the nitride chemically etched where it is not protected by the resin. The result is shown in FIG. 1.

Using the remaining nitride as etching mask, the monocrystalline silicon is etched where it is not covered with nitride, by a vertical anisotropic etching method (by CCl4 plasma for example or by reactive ionic etching), over a thickness h of about 0.5 micron.

Figure 2:
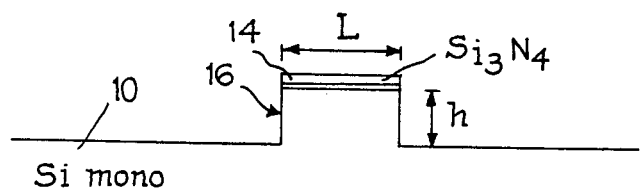

There then remain monocrystalline silicon islets 16 with substantially vertical sides, projecting above the surface of the wafer, these islets having a small width L and being coated with a layer of silicon nitride 14 (FIG. 2).

Figure 3:
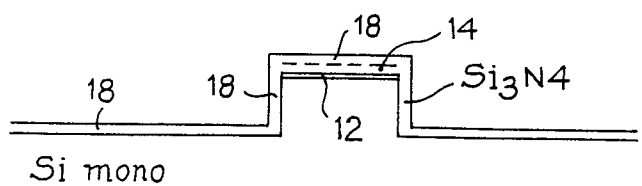

Then a second nitride layer 18 is uniformly deposited, so as to cover not only the surface of the wafer but also the vertical sides and the upper surface of the islets; this latter is already coated with nitride, so that at the end of deposition it has a thickness of nitride greater than that which exists on the rest of the surface of the wafer (FIG. 3).

Figure 4:
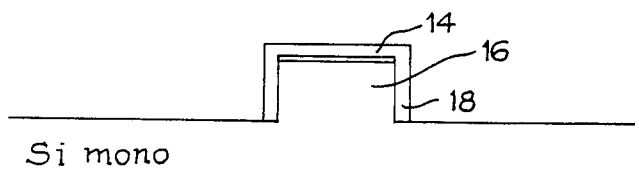

Then anisotropic etching of the silicon nitride is carried out substantially vertically, by reactive ionic etching or by anisotropic plasma etching (for example SF6 plasma for example anisotropic for the nitride). The etching is discontinued when a vertical thickness of nitride has been removed equal to the thickness of the second layer, i.e. in practice when the silicon is bared outside the islet 16. Discontinuation of the etching may be determined more especially by detecting, by optical or physical means (detection of pressure change), the beginning of etching of the bared silicon. There then remains on the wafer islets 16 of monocrystalline silicon coated on their sides with silicon nitride (generally without interposition of silicon oxide) and coated on the top with thin oxide and with silicon nitride (FIG. 4).

Then isotropic etching of the silicon takes place where it is not protected by the nitride, for example by means of an $SF_6$ plasma (isotropic for etching the silicon) or by means of a chemical bath. The duration and conditions of etching are chosen so that the silicon is hollowed out over a depth p substantially equal to a quarter of the width L of the islets, for example 0.25 micron for an islet of 1 micron in width. For the islets which are to be dielectrically isolated, a small width L will be chosen of the order of 1 micron so that it is not necessary to hollow out the silicon too deeply. The isotropic nature of the etching of the silicon results in the silicon being partially hollowed out under the islets over a lateral distance d substantially equal to the vertical etching depth p of the silicon, the edges of the islet remaining overhanging over this distance d (FIG. 5).

Figure 6:
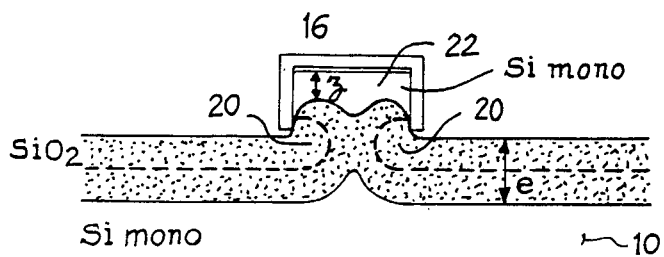

Finally thick thermal oxidization of the silicon is carried out so that the silicon is oxidized over the whole of its bared surface, including under the overhanging edges of the islets, over a thickness such that the oxide layers 20 created on each side of the width 1 of the islet join up at the center of the islet; a monocrystalline silicon zone 22, forming the upper part of the islet 6, is thus completely isolated by the thick oxide 20 (FIG. 6).

Figure 5:
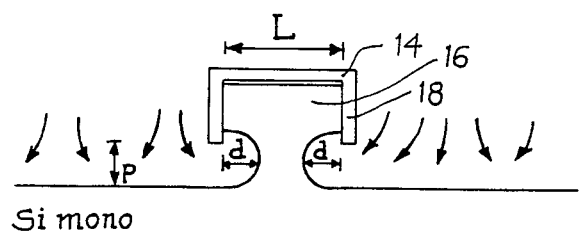

As is known, thermal oxidization "consumes" a part of the thickness of the silicon (about half the final oxide thickness), that is to say that in practice, in order to make up the monocrystalline silicon thickness L−2d forming the foot of the islet in FIG. 5, a thickness e of oxide substantially equal to L−2d must be grown over the whole surface of the wafer. In FIG. 6 has been shown with broken lines the initially bared surface of the silicon so as to show that the oxide grows practically as much outside as inside this surface.

Of course, for the monocrystalline silicon zone 22 to be usable, it must have a minimum height z and it must not be completely invaded by the rise of the thick oxide. This supposes then an initial silicon islet height h (FIG. 2) which is sufficiently high with respect to the width L of the islet, for example h equal to z+L−2d where z is the minimum height of monocrystalline silicon which it is desired to keep.

By way of example, the height z may be equal to 0.5 micron and, if d=0.25 micron, it will be necessary to create initially islets of height h (FIG. 2) equal to approximately the width L of the islet. In these Figures, a case has been shown in which a smaller value of z (for example 0.25 Micron) and a hollowed out depth d greater than ¼, for example 0.3 micron, have been accepted so that the height h may be substantially equal to half the width L.

It may be noted that there is no "bird's beak" phenomenon risking raising the nitride during thick oxidization on the sides of the islet for the nitride rests directly on the silicon of the islet.

The last step not shown will consist in removing the nitride remaining on the top and on the sides of the islet, after which the desired integrated circuit elements may be formed on the islets.

The monocrystalline silicon is thus dielectrically isolated from the substrate and is of the same quality as the silicon of the substrate.

Before etching the islets 16, the surface of the wafer may have received different dopings: for example implantations may have been carried out for forming caissons or for forming transistor sources and drains.

Bipolar circuits such as MOS circuits may be formed by this method.

If, at certain locations, islets are provided which are sufficiently wide so that the final oxidization does not make up the width L−2d of the foot of the silicon islet after the isotropic etching of the silicon as shown in FIG. 5, some circuit elements may be connected to the substrate.

The structure provided allows both elements dielectrically isolated from the substrate and non isolated elements or conventionally isolated by junctions to be formed in a perfectly compatible way on the same circuit chip.

Finally, the method described is particularly simple: it only comprises a small number of very conventional steps, with a single mask for defining the islets.

What is claimed is:

1. A method for forming monocrystalline silicon islets isolated from the substrate on an integrated circuit, comprising the following steps:
   a. provision of a monocrystalline semi conductor wafer which is coated, possibly after thin oxidization, with a first layer of silicon nitride,
   b. etching the nitride with a pattern leaving zones of small width (FIG. 1),
   c. vertical hollowing out of the monocrystalline silicon outside the places protected by the nitride, so that monocrystalline silicon islets remain whose upper surface is coated with nitride (FIG. 2),
   d. deposition of the second silicon nitride layer which covers the surface of the wafer as well as the sides of the islet and the first nitride layer (FIG. 3),
   e. vertical anisotropic etchinq of the nitride until the silicon is bared outside the islets, the nitride of the second layer then remaining on the sides of the islets and that of the first layer remaining on the top of the islets (FIG. 4),
   f. isotropic etching of the bared silicon outside the islets protected by the nitride, this etching extending partially under the islets (FIG. 5),
   g. thick thermal oxidization of the wafer for a time sufficient for a silicon oxide layer to be formed extending completely under the islets and isolating them dielectrically from this substrate (FIG. 6),
   h. the nitride layer remaining on the islets is removed.

2. The method as claimed in claim 1, wherein the height h of the monocrystalline silicon islets, after step c, is at least about half of the width L of the islets.

3. The method as claimed in claim 1, wherein the etching depth p of the silicon in step f is substantially equal to a ¼ of the width L of the islets.

* * * * *